United States Patent
Bird et al.

[11] Patent Number: 5,857,572
[45] Date of Patent: Jan. 12, 1999

[54] COMPONENT CARRIER TAPE

[76] Inventors: Gerald C. Bird; Steven J. Flynn; David L. Vall, all of P.O. Box 33427, St. Paul, Minn. 55133-3427

[21] Appl. No.: 576,405

[22] Filed: Dec. 21, 1995

[51] Int. Cl.⁶ .................................................. B65D 73/02
[52] U.S. Cl. ........................................ 206/713; 206/716
[58] Field of Search ..................... 206/390, 523, 206/709, 713, 714, 719, 716

[56] References Cited

U.S. PATENT DOCUMENTS

| | | | |
|---|---|---|---|
| 4,231,901 | 11/1980 | Berbeco | 206/719 |
| 4,298,120 | 11/1981 | Kaneko et al. | 206/329 |
| 4,581,262 | 4/1986 | Karabedian . | |
| 4,657,137 | 4/1987 | Johnson | 206/329 |
| 4,702,788 | 10/1987 | Okui | 156/252 |
| 5,132,160 | 7/1992 | Bird | 428/159 |
| 5,150,787 | 9/1992 | Bird et al. | 206/329 |
| 5,203,143 | 4/1993 | Gutentag | 53/452 |
| 5,396,988 | 3/1995 | Skrtic | 206/714 |

FOREIGN PATENT DOCUMENTS

| | | | |
|---|---|---|---|
| 1-316198 | 12/1989 | Japan | B26F 1/40 |
| 4-128147 | 4/1992 | Japan | B65D 73/02 |
| WO 94 00971 A1 | 1/1994 | WIPO . | |

OTHER PUBLICATIONS

Technical Information—Surface Mount Supplies, 3M brand 4361 Punch Tape ©3M 1993 70–0705–2016–1 (063.05).

*Primary Examiner*—David T. Fidei
*Attorney, Agent, or Firm*—Michaele A. Hakamaki

[57] ABSTRACT

A component carrier tape used for storing and transporting components, wherein the carrier tape comprises a single layer elongated flexible strip portion having properties suitable for storing and transporting a plurality of components. The single layer strip portion comprises a layer of thermoplastic polymeric foam and has a first surface, a second surface opposite the first surface, and a plurality of openings spaced along the strip portion and extending through the strip portion between the first and second surfaces for receiving the plurality of components. The carrier tape further includes a bottom strip bonded to the second surface of the strip portion, extending along the strip portion, and covering at least a portion of the plurality of spaced openings. The carrier tape may further include a top cover tape realeasably secured to the first surface of the strip portion, extending along the strip portion, and covering at least a portion of the plurality of spaced openings.

17 Claims, 2 Drawing Sheets

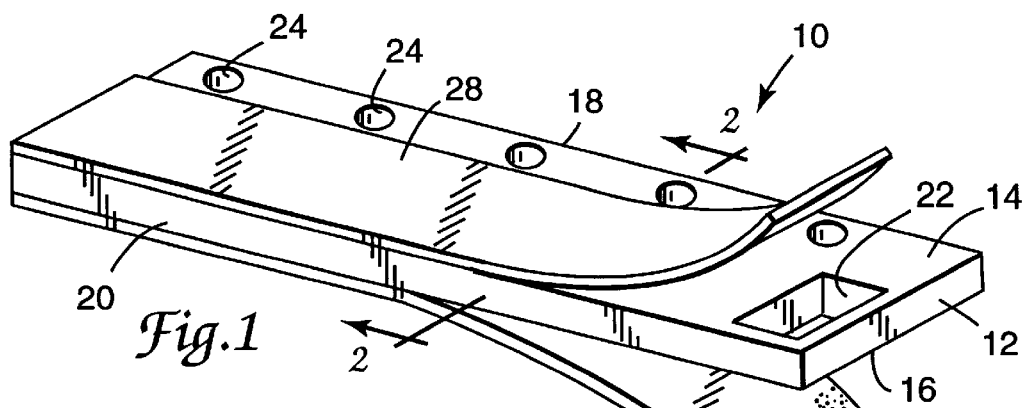
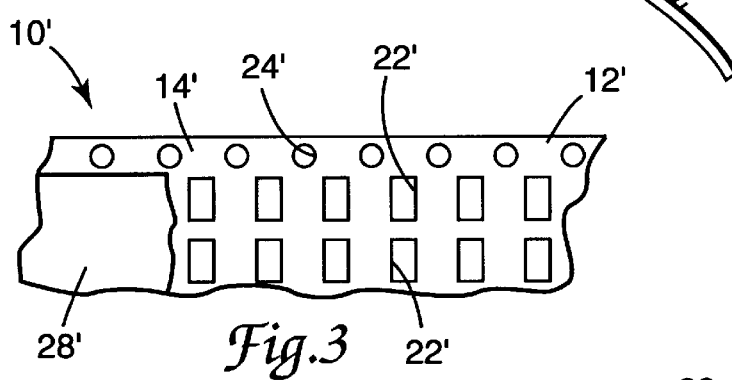
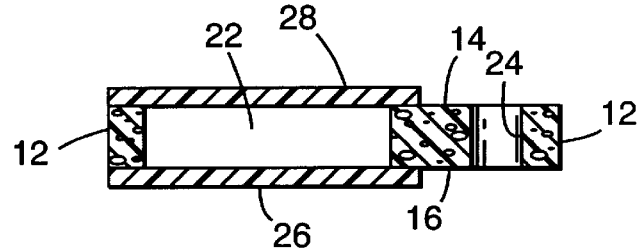
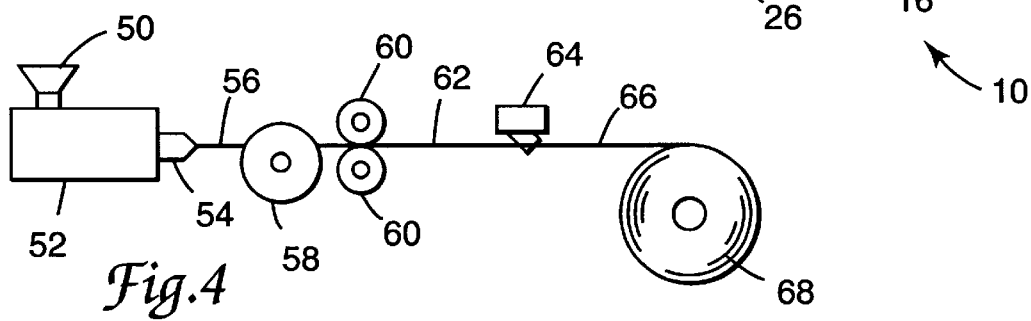
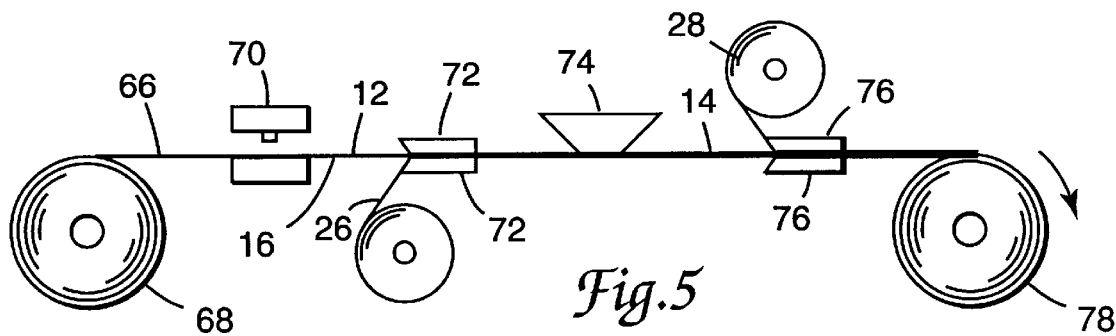

COMPONENT CARRIER TAPE

BACKGROUND OF THE INVENTION

1. Technical Field

This invention relates generally to a carrier tape that is used to transport components from a component manufacturer to a different manufacturer or to an assembler that assembles the components into new products. More specifically, this invention relates to flexible carrier tapes for storing electronic surface mount components and for supplying those components seriatim to a machine.

2. Description of the Related Art

In the field of electronic circuit assembly, it is common to use robotic placement equipment to move electronic components such as resistors, capacitors, or memory chips from a supply source to a circuit board for attachment in a specific location on the circuit board. After attachment to the circuit board, the circuit board may be further incorporated into an electronic device.

High speed automated robotic placement equipment is often used for electronic circuit assembly, where a typical robotic component placement machine can place between 1,000 and 30,000 components per hour on circuit boards. More specifically, the placement of components on circuit boards is often accomplished with vacuum pick-up devices that draw vacuum pressure through small orifices. The vacuum pressure is sufficient to attract components to the vacuum pick-up devices from a supply source and this pressure is maintained while moving the components to their desired locations on circuit boards. The vacuum pressure is then sufficiently reduced to allow the components to detach from the vacuum devices. This sequence of picking up a component and placing it on a circuit board is repeated for each circuit board or series of circuit boards that require components to be affixed to their surfaces. The automated robotic placement equipment is programmed to perform this sequence of movements at a high speed. To keep the robotic placement equipment operating at high speeds through multiple cycles, the vacuum devices must be capable of picking up the required components during each cycle. Because the vacuum device orifices are typically quite small, it is advantageous to minimize contaminants near the orifices during operation of the vacuum devices to prevent clogging of the orifices.

A common way to supply components to robotic placement equipment is by a carrier tape. With a carrier tape, a component manufacturer typically loads components into a series of pockets that are precisely spaced along the length of the carrier tape, covers the components with a cover tape, and winds the loaded carrier tape into a roll or onto a reel. The loaded carrier tape may then be used to transport the components from the component manufacturer to another manufacturer or to an assembler, where the roll of carrier tape may be mounted within an assembly process. The carrier tape is typically unwound from the roll and automatically advanced toward a robotic pick-up location. As the carrier tape advances, the robotic placement equipment removes the cover tape, after which it removes the components from each succeeding pocket of the carrier tape, such as with a vacuum pick-up device, to assemble the components into new products.

One type of carrier tape, known as a punched carrier tape, is illustrated in U.S. Pat. No. 4,702,788 (Okui) and 5,203,143 (Gutentag). The pockets of punched carrier tapes are typically formed by die punching a series of holes through a strip of material that is slit from a sheet of the material having a thickness corresponding to the depth of the pockets to be formed. An adhesive tape is often adhered to one side of the strip of material so that some portion of the adhesive tape is exposed to the inside of the pocket, thereby creating the bottom of the pocket. To use a punched carrier tape, a component is typically placed onto the adhesive surface in each pocket, over which a cover strip may be affixed. The carrier tape may then be wound into a roll and transported to another assembler or manufacturer.

The strips of material used for punched carrier tapes are often strips of paper that are slit from larger sheets of paper. The processes of slitting the paper sheets into strips and punching holes into the strips of paper often creates residual fine dust particulates in the pockets and on the face of the carrier tape. These particulates can contaminate components that are placed in the pockets, which may make the components unusable. The particulates may also obstruct the small vacuum orifices of some robotic placement equipment, thereby decreasing the performance of the vacuum devices such that they can no longer pick up components, or may otherwise interfere with the ability of the robotic placement equipment to recognize and grasp components in the pockets. The vacuum equipment must then be serviced, which can be both expensive and time consuming.

Paper carrier tapes also cause other concerns. Carrier tape paper typically uses a filler, such as clay, which is abrasive to die punch tools. This causes accelerated wear of the tools and poor quality hole punching. The fact that paper carrier tapes are typically made of multiple paper layers laminated to each other also causes problems. In the presence of moisture, the paper layers tend to expand and change dimensions, which can cause delamination of the paper layers. In addition, these multiple paper layers tend to delaminate from each other when wound about a reel, particularly when the paper is thick. Therefore, the thickness of paper strips are often limited to about 1 millimeter (0.04 inch), which limits the thickness of components that can be stored in the carrier tape. Finally, because paper carrier tapes tend to be fairly rigid, they have an inherent tendency to unwind from a core about which they are wound and return to a linear position, which is an effect known as "watch-springing." Watch-springing leads to difficulty in handling reels of paper carrier tape in both loading and unloading operations.

To address some of the concerns associated with paper carrier tapes, it is known to make the strips of material from nonwoven materials, such as a layer of nonwoven polymeric fibers adhered together at their crossover points. One example of such a carrier tape is illustrated in U.S. Pat. No. 5,150,787 (Bird et al.). Nonwoven polymeric carrier tapes are typically more flexible (i.e., less prone to the watch-springing effect) and less abrasive than paper carrier tapes. In addition, the dust particulates generated when slitting and punching paper tapes are not generated when producing nonwoven polymeric carrier tapes. However, residual stray fibers can extend into the pockets and from the face of the carrier tape. These fibers can obstruct the small vacuum orifices of some robotic placement equipment, or may otherwise interfere with the ability of the robotic placement equipment to recognize and grasp components. In addition, the process of blowing microfibers for nonwoven polymeric materials can be expensive and complex.

Another material suggested for the strips of material used in punched carrier tapes is a multi-layer laminated polymeric foam structure, as in U.S. Pat. No. 4,657,137 (Johnson). This carrier tape requires the use of at least two separate layers and is produced by providing a flexible thin plastic or foam layer to which a strong and stable base layer is laminated. The base layer is selected to provided the desired strength for the tape structure.

In view of the disadvantages of conventional carrier tapes, it is therefore desirable to provide a low cost carrier tape that can be produced easily and inexpensively and that does not leave dust or stray fibers when slit and punched.

SUMMARY OF THE INVENTION

In one embodiment, the invention relates to a component carrier tape used for storing and transporting components. The carrier tape comprises a single layer elongated flexible strip portion having properties suitable for storing and transporting a plurality of components. The single layer strip portion comprises a layer of thermoplastic polymeric foam and has a first surface, a second surface opposite the first surface, and a plurality of openings spaced along the strip portion and extending through the strip portion between the first and second surfaces for receiving the plurality of components. The carrier tape further includes a bottom strip bonded to the second surface of the strip portion, extending along the strip portion, and covering at least a portion of the plurality of spaced openings. The carrier tape may further include a top cover tape realeasably secured to the first surface of the strip portion, extending along the strip portion, and covering at least a portion of the plurality of spaced openings.

The strip portion may comprise a blend of polystyrene and polyethylene, and more specifically may comprise about 10 to 49 percent by weight polystyrene and about 51 to 90 percent by weight polyethylene, wherein the sum of the polystyrene and polyethylene is 100 weight percent. The strip portion may also have about 10 to 60 percent open spaces that may contain air, and may have an average density of 0.25 to 1.0 grams per cubic centimeter.

In another embodiment, the invention relates to a non-fibrous elongated flexible component carrier tape for storing and transporting a plurality of components. The carrier tape comprises a strip portion having a first surface, a second surface opposite the first surface, and a plurality of openings spaced along the strip portion and extending through the strip portion between the first and second surfaces for receiving the plurality of components. In this embodiment, the strip portion comprises a layer of thermoplastic polymeric foam. The carrier tape further includes a bottom strip bonded to the second surface of the strip portion, extending along the strip portion, and covering at least a portion of the plurality of spaced openings.

BRIEF DESCRIPTION OF THE DRAWINGS

The invention will be more fully appreciated with reference to the following drawings in which similar reference numerals designate like or analogous components throughout and in which:

FIG. 1 is a perspective view of one embodiment of a carrier tape according to the present invention having a bottom tape and a cover tape adhered thereto, and having end portions separated to show details of the carrier tape;

FIG. 2 is an enlarged cross-sectional view taken approximately along line 2—2 of FIG. 1;

FIG. 3 is a fragmentary plan view showing another embodiment of a carrier tape according to the present invention having a portion of the cover tape removed;

FIG. 4 is a schematic view illustrating a first part of a method according to the present invention for making the strip portion included in the carrier tape of FIGS. 1 and 2;

FIG. 5 is a schematic view illustrating a second part of the method for making the strip portion included in the carrier tape of FIGS. 1 and 2, also including loading the carrier tape with components.

DETAILED DESCRIPTION OF THE PREFERRED EMBODIMENTS

Figure 6:
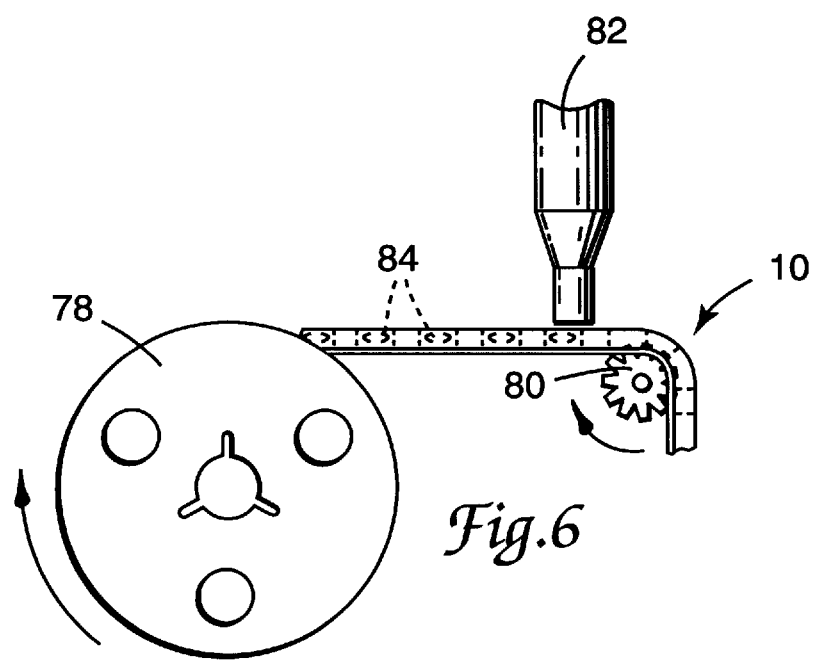
FIG. 6 is a schematic view illustrating a robotic machine removing components from a carrier tape according to the invention.

Referring now to the drawings, and initially to FIGS. 1 and 2, a first embodiment of a carrier tape 10 according to the present invention is shown. Carrier tape 10 may be used to transport components (e.g., electronic components, such as surface mount components, including resistors, memory chips, integrated circuits, and capacitors) from a component manufacturer to a different manufacturer that removes the components from the carrier tape and assembles the components into new products. More specifically, carrier tape 10 is preferably an elongated flexible tape having a strip portion 12 defining a top surface 14 and a bottom surface 16 opposite the top surface. Strip portion 12 includes longitudinal edge surfaces 18 and 20 on opposite transverse sides of strip portion 12, a predetermined thickness between top surface 14 and bottom surface 16, and a series of spaced openings 22 through strip portion 12 between the top and bottom surfaces 14, 16. Strip portion 12 also includes at least one row of aligned advancement holes 24 formed in strip portion 12 and extending in a row spaced inwardly from one of the longitudinal edge surfaces 18 and 20. An optional second row of advancement holes 24 (not shown separately in the drawings) may be spaced inwardly from the other longitudinal edge surface. Advancement holes 24 are typically sized and spaced to engage with a specific advancement mechanism (not shown). The advancement mechanism may comprise, for example, one sprocket for each row of advancement holes 24, where the teeth of each sprocket engage advancement holes 24 to advance carrier tape 10 toward a predetermined location so that the robotic placement equipment may either place components on the carrier tape or remove components from the carrier tape.

The openings 22 and the predetermined thickness of the strip portion 12 may be designed to conform to the size and shape of the components that are to be received within the openings 22. Specifically, the predetermined thickness of the strip portion is preferably greater than the thickness of the components, and the size and shape of the openings 22 are designed so that the openings are not deformed when components are placed therein. However, openings of a generic design may accommodate components of widely varying sizes and shapes. In addition, although the openings 22 are illustrated as rectangular in shape, the openings may instead be another shape, such as circular, oval, triangular, pentagonal, or any other suitable shape. It is preferable that each opening 22 be the same size and shape as the other openings 22 and that each opening 22 be adapted to receive a single component. It is also preferable that the openings 22 are spaced equally from each other in an aligned row along the length of carrier tape 10.

Carrier tape 10 may also include a bottom tape or strip 26 bonded to the bottom surface 16 of strip portion 12 to cover at least a portion of the openings 22. The bottom strip 26 may be bonded directly to the bottom surface 16 with or without adhesive. For example, the bottom strip may include a film layer (e.g., polyester film, nylon film, or polypropylene film) which may have heat-activated adhesive or pressure sensitive adhesive on one surface for adherence to bottom surface 16. Alternatively, the bottom strip 26 may be an adhesive-free film product. Bottom strip 26 may also be secured to strip portion 12 by other known means, such as with an adhesive 27 on the bottom surface 16 or on both the bottom surface 16 and the bottom strip 26. In one preferred embodiment, the adhesive may be any of a wide variety suitable to secure the bottom strip 26 to the bottom surface 16, such as hot melt adhesives, pressure sensitive adhesives, solvent-coated adhesives, and heat-activated adhesives. Alternatively, the bottom strip 26 may be secured to the carrier tape by heating strip portion 12 until it becomes sufficiently tacky, then applying bottom strip 26 to bottom surface 16. When strip portion 12 cools so that it is no longer tacky, the bottom strip 26 will become secured to bottom surface 16. Bottom strip 26 thereby forms a base for the openings 22 and creates a surface on which components (not shown) may be retained when placed within openings 22. It is preferable that the bottom strip 26 completely cover the openings in the bottom surface 16 to form a pocket for storage of components. Optionally, the portion of the bottom strip 26 that is exposed to the inside of the openings 22 may have an adhesive thereon, such as adhesive 27, for retaining components within the pockets.

After components are placed in the openings 22 of strip portion 12, a cover tape or strip 28 may then be releasably secured along the top surface 14 of strip portion 12 to cover at least a portion of the openings 22. Cover strip 28 thereby seals the components within the openings 22. The cover strip 28 may include a film layer (e.g., polyester film, nylon film, or polypropylene film) which may have a heat-activated adhesive or pressure sensitive adhesive on one surface for adherence to top surface 14. Alternatively, the cover strip 28 may be an adhesive-free film product. The method and adhesive used for fastening cover strip 28 to top surface 14 are preferably of the type that allow cover strip 28 to be easily peeled away from top surface 14 when the stored components are to be removed from the carrier tape. In one preferred embodiment, the adhesive may be any of a wide variety suitable to releasably secure the cover strip 28 to top surface 14, such as hot melt adhesives, solvent-coated adhesives, and heat-activated adhesives. Alternatively, the cover strip 28 may be secured to the carrier tape by heating strip portion 12 until it becomes tacky, then applying cover strip 28 to top surface 14. When the strip portion 12 cools so that it is no longer tacky, the cover strip 28 will become secured to top surface 14. With either of these methods, pressure may be applied along the edges of the cover strip to uniformly secure the cover strip to the carrier tape.

FIG. 3 illustrates another embodiment of a carrier tape 10' having a top surface 14' according to the present invention. In this embodiment, two or more columns of openings 22' are formed in a strip portion 12' along the length of carrier tape 10' to facilitate the transportation of more than one row of components. Each column of openings 22' may have similarly sized and shaped openings 22' as other columns of openings, or each column of openings 22' may have differently sized and shaped openings from other columns of openings Strip portion 12 of the present invention is formed of a layer of a thermoplastic polymeric foam that is sufficiently flexible to allow the carrier tape 10 to easily be wound about a core (i.e., minimize the watch springing effect), yet is sufficiently strong to give the carrier tape structural integrity without additional support or stabilizing layers. Thermoplastic polymeric foams of the type contemplated by the present invention are cellular products that are considered to be non-fibrous since they do not have fibers and therefore do not generate dust particles and loose fibers of the type generated by fibrous or paper products during slitting and punching processes. In a preferred embodiment, the polymeric foam is a closed cell foam that is comprised of a blend of polymeric materials, where each polymeric material contributes to some desirable characteristic of the foam product. Alternatively, a single polymeric material having the desired properties could be used for the foam. The polymeric materials selected should provide a foamed material having sufficient toughness so that the material does not tear during punching, having a low elongation to minimize the tendency of the foamed material to stretch, and sufficient flexibility to allow the foamed material to be easily wound about a core. A wide variety of polymeric materials may comprise the polymeric blend, such as, for example, polyesters (e.g., polyethylene terephthalate and ethylene glycol modified polyethylene terephthalate), polyolefins (e.g., low density polyethylene, linear low density polyethylene, high density polyethylene, and polypropylene), polystyrene, polycarbonate, nylon, acrylics, acrylonitrile-butadiene-styrene, and copolymers of the foregoing materials.

In one preferred embodiment, the blend of polymeric materials may comprise low density polyethylene and polystyrene, where the polystyrene contributes to the stiffness of the polymeric foam, and the polyethylene contributes to the flexibility of the polymeric foam, and the blend of polyethylene and polystyrene contribute to a desirable amount of foaming. In this embodiment, it is preferable that the blend comprise about 10 to 49 percent by weight polystyrene and about 51 to 90 percent by weight polyethylene, so that the sum of the polystyrene and polyethylene is 100 weight percent. It is even more preferable, however, that blend comprise between 25 and 35 percent by weight polystyrene and between 65 and 75 percent by weight polyethylene.

The thermoplastic foam preferably has a density between 0.25 grams per cubic centimeter (15.6 pounds per cubic foot) and 1.0 grams per cubic centimeter (62.43 pounds per cubic foot). The thermoplastic foam also preferably has between about 10 and 60 percent open spaces, and most preferably has between about 40 and 50 percent open spaces. The percent open spaces is also commonly referred to as the density reduction of the material, such that the thermoplastic foam having 10 percent open spaces has a corresponding density reduction of 10 percent, for example. These open spaces are typically air-filled, but may also contain residual gases, such as carbon dioxide, nitrogen, and other residual gases produced by chemical blowing agents that remain from the foaming operation. The amount of density reduction is controlled by the amount of foaming of the thermoplastic material and is selected to achieve certain characteristics in the strip portion. For example, a foam with 60 percent density reduction will require less raw thermoplastic materials than a foam with 10 percent density reduction. In addition, foams with higher densities will typically have more strength than foams with lower densities.

Thermoplastic polymeric foams of the type contemplated by the present invention are considered to be closed cell foams. The sizes and shapes of the cells may vary throughout the foam, where cell sizes are measured as the average diameter of a cell. The average cell size throughout the foam is preferably in the range of 10 microns ($\mu$m) to 500 $\mu$m and more preferably in the range of 50 $\mu$m to 200 $\mu$m. However, no cell may have a diameter larger than the thickness of the foam. Varying the number and size of cells in a particular foam will provide different properties for the foam, such as different densities and strengths.

In a preferred embodiment, the thermoplastic polymeric foam material is electrically dissipative, and may include an electrically conductive material, such as carbon black, which is either interspersed within the material, or is coated on the carrier tape either before or after the tape is formed. The electrically conductive material allows an electric charge to dissipate throughout the carrier tape and preferably to the ground. This feature may prevent damage to the components contained within the carrier tape due to an accumulated electric charge. The thermoplastic polymeric foam may also include other materials to vary the properties of the foamed sheet. For example, additives such as anti-static materials, desiccants, humidicants, adhesion modifiers, or the like may be added to the raw materials.

Strip portion 12 should have sufficient strength to resist tearing or breaking during manufacture and under normal use conditions (e.g., winding and unwinding operations), especially since removal of material for the openings and advancement holes during die punching reduces the inherent strength of the strip portion. Therefore, it is preferable that the tensile strength of the polymeric foam be least 500 pounds per square inch (psi). The strip portion should also experience minimal elongation during manufacture. If the strip portion stretches during die punching, the resulting component openings and advancement holes may be improperly aligned, shaped, and spaced apart. To minimize deformation, the percent elongation of the strip portion at break is preferably less than 7 percent, and more preferably less than 5 percent.

FIG. 4 illustrates a method according to the present invention for making strip portions 12 for carrier tape 10. In general, foaming of polymeric materials is a process that is familiar to those of ordinary skill in the art and is described in various references such as *Handbook of Polymeric Foams and Foam Technology* (Daniel Klempner and Kurt C. Frisch eds., Hanser Publishers 1991), which discusses different methods of foaming polymeric materials. Many of these can be employed to manufacture the carrier tapes of the invention. Quite advantageously, strip portion 12 can be easily manufactured by extrusion. The desired raw polymeric materials, usually in the form of pellets or the like, are supplied by a material feeder 50 to an extruder 52, where it is conveyed, melted, mixed, and forced to the end of the extruder under pressure. The materials that comprise the blend may require the same or different extruder temperatures for processing, however, the extruder temperature should be high enough to allow proper extrusion of a uniform, well-blended mixture. The extruder 52 may comprise equipment of several different configurations, such as single-screw extruders, twin-screw extruders, tandem-extruder lines, and other known configurations. Parameters such as the desired thickness and width of the material exiting the extruder and the extrusion rate are typically taken into consideration when choosing appropriate extrusion equipment.

As illustrated, a film 56 is formed in a known manner by extruding the polymeric materials through a die 54 fed by the extruder 52. The die 54 is preferably of the type commonly known as a film-forming die or slot die (i.e., a die which generally includes a long, narrow orifice through which materials are extruded into a film product). Alternatively, an annular die may be used (i.e., a die having a circular opening through which the polymeric materials are extruded in the form of a tube which is then slit open to form a flat sheet). In one preferred embodiment, the die 54 is a film-forming die having an orifice that is 10 inches wide by 0.040 inches high. As the polymer blend exits the die 54, it preferably has a viscosity that is sufficiently low to flow through the die under safe operating pressures, but high enough to withstand the forces that will be generated by gas expansion while creating a stable, uniform cell structure. The foaming of the raw polymeric materials typically occurs outside the die, typically by one of three methods, explained below.

In the first method, one or more chemical foaming agents are added to the polymeric material in the material feeder 50. Chemical foaming agents, which are also commonly referred to as chemical blowing agents, are typically easy to use for foaming polymeric blends because polymeric material blends that include a chemical foaming agent may be extruded in the same manner and with the same equipment as polymeric material blends that do not include a chemical foaming agent. When a polymeric material blend having a chemical foaming agent is extruded, the chemical agent decomposes to release a gas, which causes cells to form in the polymeric material blend as it leaves the extruder. Chemical foaming agents may be either in liquid or solid form and can be either organic or inorganic compounds that decompose at a temperature that is lower than the extruder temperature, thereby converting into a gas or mixture of gases that form the cellular structure of the foam.

The chemical foaming agent used in the present invention may be either an endothermic foaming agent or an exothermic foaming agent. Endothermic chemical foaming agents absorb heat during decomposition and include, for example, SAFoam™ endothermic chemical blowing agent from Reedy International Corporation of Keyport, N.J. and Hydrocerol™ endothermic chemical blowing agent from B.I. Chemicals, Henley Division, of Montvale, N.J. Exothermic chemical foaming agents release heat during decomposition and include, for example, azodicarbonamide (e.g., Kempore™ organic chemical blowing agent and Celogen™ organic chemical blowing agent from Uniroyal Chemical Company, Inc. of Middlebury, Conn.), 4,4'-oxybis (benzenesulfonyl) hydrazine (OBSH) (e.g., Celogen™ OT chemical blowing agent from Uniroyal Chemical Company, Inc.), and p-toluene sulfonyl hydrazide (e.g., Celogen™ TSH chemical blowing agent from Uniroyal Chemical Company, Inc.). A preferred foam-forming composition for use in the invention preferably comprises about 0.2 to 5 percent chemical foaming agent by weight, about 10 to 49 percent polystyrene by weight, and about 51 to 90 percent polyethylene by weight, where the sum of the three products equal 100 weight percent.

The second method of foaming includes injecting gas or liquid directly into the extruder to cause foaming. These gases or liquids are typically referred to as physical foaming agents, which cause foaming either by evaporation upon application of heat or by expansion upon release of pressure. Physical foaming agents, however, require additional processing equipment to introduce the foaming agent to the polymeric material mixture. Although either chemical or physical foaming agents can be used for the present invention, physical foaming agents typically allow for greater density reductions in foam extrusion. More specifically, chemical foaming agents generally have a limitation of about 50 to 60 percent density reduction while physical foaming agents allow for density reductions greater than 60 percent. Therefore, physical foaming agents are typically used when higher density reductions are desired for the foamed material. Typical materials used as physical foaming agents include, for example, hydrofluorocarbons, hydrocarbons (e.g., butane and pentane), and methylene chloride.

In a third method, chemical and physical foaming agents may be used simultaneously to cause foaming of a particular polymeric material blend. In this method, the chemical foaming agent can be used as a nucleating agent for the physical foaming agent.

In most cases where a chemical foaming agent is used, the foaming agent decomposes during the foaming process such that little or no residual material is present in the foamed material. However, some residual material from the foaming agent may remain in the foamed material after foaming. This residual material may or may not later decompose or dissipate into the foamed material.

Next, the foamed film 56 passes over a cooling cylinder 58, after which it may be heated and compressed in a nip between a pair of temperature-controlled cylindrical rollers 60 to form a flexible sheet 62 having relatively flat top and bottom surfaces. The rollers 60 are maintained at an appropriate distance from each other to achieve the desired properties without damaging the flexible sheet 62. Although it is preferable that the sheet be extruded and foamed as described, other known methods of manufacturing foamed polymers may also be used, such as, for example, oven expansion foaming where a polymer sheet is extruded then foamed in an oven.

The flexible sheet 62 is then slit with conventional slitting equipment 64 to form a plurality of strips, where only a single strip 66 is shown. The strips 66 may be helically or concentrically wound about the hub of a reel to form a supply roll 68 of the strips 66. More than one strip 66 may be wound about a single hub to make a single supply roll with multiple strips, or each strip 66 may be wound about its own hub.

The supply roll 68 may then be transported to other machinery where operations illustrated in FIG. 5 take place. The strip 66 is unwound from the supply roll 68 and conventional punching equipment 70 is used to punch the series of openings 22 and advancement holes 24 illustrated in FIGS. 1 and 2 into the strip portion 12. In general, punching holes into the extruded thermoplastic polymeric foam strip does not generate the dust particles that are generated when punching holes into paper strips. The bottom strip 26 is then applied to the bottom surface 16 of the strip portion 12 as it passes between a pair of platens 72 to provide the bottom walls across the openings 22. The platens 72 may be heated, particularly when the bottom strip 26 and/or strip portion 12 must be heated to allow the two surfaces to adhere to each other. Alternatively, the platens 72 need not be heated, especially when bottom strip 26 includes a pressure sensitive adhesive that is sufficiently tacky at room temperature to secure the bottom strip 26 to the strip portion 12. When a pressure sensitive adhesive of this type is used, a laminator roller (not shown) may be used in place of the platens 72. The openings 22 with these bottom walls defined by the bottom strip 26 thereby define pockets along the carrier tape 10. The carrier tape 10 may then be wound again into another supply roll (not shown), where the following processes may take place, or may continue as shown in FIG. 5, where the strip portion 12 continues advancing toward a loader 74.

The loader 74 sequentially places components in the openings 22 as the carrier tape 10 passes beneath the loader 74. Cover tape 28 is then applied between a pair of platens 76 to the top surface 14 of the strip portion 12. As with the platens 72, platens 76 may or may not be heated, depending on the desired means of attaching the cover tape 28 to strip portion 12. The loaded carrier tape 10 is then wound about the hub of a reel to form a loaded roll 78 of carrier tape 10. The loaded roll 78 is then ready to be shipped to an assembler who will then remove the components from carrier tape 10 and assemble the components into other products, such as with the use of automated robotic equipment.

The portion of the method illustrated in FIG. 4 can be performed by one manufacturer who manufactures the strip portion 12, and the portion of the method illustrated in FIG. 5 can be performed by another manufacturer, such as the supplier of the components. Alternatively, the entire operation of FIG. 4 may be performed together with the punching operation and application of the bottom strip 26 illustrated in FIG. 5 by a single manufacturer. This carrier tape product may then be provided to a component supplier who can fill the carrier tape pockets with components and apply the cover tape 28. However, the operations of FIGS. 4 and 5 may be divided between manufacturers in any other manner to produce a loaded carrier tape.

The loaded roll 78 may be transported to the location where the components are to be removed, such as automated assembly equipment, where an advancement mechanism automatically advances the loaded carrier tape for removal manually or by robotic placement equipment. As illustrated in FIG. 6, carrier tape 10 is unwound from loaded roll 78 by an advancement sprocket 80 to move the carrier tape 10 toward robotic placement equipment 82. The robotic placement equipment 82 removes each successive component 84 from an opening 22 as it reaches the desired removal point by any known removal method, such as a vacuum pick-up device, and may then place the component on a particular location on a circuit board or some other desired location.

The carrier tapes of the present invention are particularly useful in the electronics industry for transporting and delivering surface mount electronic components such as memory chips, integrated circuit chips, resistors, connectors, microprocessors, capacitors, gate arrays, and the like. However, the carrier tapes may be used to transport other components such as small springs, clips, and the like.

The following non-limiting examples illustrate one method used to produce the carrier tapes of the present invention with different polymeric blends.

EXAMPLES 1 AND 2

The extruded thermoplastic polymeric foam used for the strip portions according to the invention were prepared by a foam extrusion process using a film-forming die. The sheets were formed from a polymer blend including a chemical foaming agent.

More specifically, a composition of a polymeric blend and a chemical foaming agent were dry blended and the blend was fed to a 3.18 cm (1.25 inch) diameter single screw, three-zone extruder operating between 40 and 55 revolutions per minute RPM), depending on the example. For Example 1, the extruder was operating at the following temperatures: Zone 1, 121° C. (250° F.); Zone 2, 188° C. (370° F.); Zone 3, 221° C. (430° F.); and die temperature, 182° C. (360° F.). For Example 2, the extruder was operating at the following temperatures: Zone 1, 127° C. (260° F.); Zone 2, 177° C. (350° F.); Zone 3, 204° C. (400° F.); and die temperature 193° C. (380° F.). The material blend was melted and forced to the end of the extruder and fed to a single layer flat film extrusion die. During this process, the chemical blowing agent decomposed to form a gas. The die orifice was 25.4 cm (10 inches) wide and had a die gap between 0.5 mm (0.020 inch) and 1 mm (0.040 inch), through which the material blend was extruded, with a pressure at the extruder exit of about 1740 pounds per square inch.

Upon exiting the die, the formed gas expanded to foam the polymeric material blend and create a foamed material sheet that was approximately 20.32 cm (8 inches) wide. The foamed material sheet was removed from the die with the aid of a cooling cylinder maintained at a temperature of about 24° C. (76° F.).

The foamed sheet was then slit in-line by a score slitter into strips 32 mm wide. The strips were wound into rolls, which were subsequently unwound and shear slit into four 8 mm wide strips. These strips were wound again onto separate cores and these cores were loaded onto a Nitto PM 1200 flat punch machine. The strips were unwound from the cores and fed through the machine where component openings of 3.05 mm (0.120 inches) by 1.52 mm (0.060 inches) and advancement holes of 1.5 mm (0.059 inches) in diameter were punched into the strips. A bottom strip (polyester film with heat-activated adhesive) was applied to the bottom surface of the strips and components were placed in the openings. A cover tape (2653 Heat-Activated Cover Tape from 3M Company of St. Paul, Minn.) was then heat sealed to the strips at a temperature of 120° C. The loaded carrier tapes were then wound onto separate 7.62 cm (3 inch) cores to make separate rolls.

With each of the samples, several properties of the strip portions were measured. To determine the density of each sample, the sample was weighed on a scale and the dimensions were measured with a micrometer to calculate the volume; dividing the weight by the volume provided the density of the sample. The tensile strength at break and percent elongation of the samples was determined through use of a standard tensile test as described in American Society for Testing and Materials (ASTM) D638, using an Instron 1122 computer assisted tensile tester set at a cross head speed of 20 inches/minute, using a sample size for Example 1 of 8 mm wide, 50.8 mm long, and 0.72 mm thick and a sample size for Example 2 of 8mm wide, 50.8 mm long, and 0.90 mm thick.

In the first example, the composition of the material blend comprised 68.5 percent by weight low density polyethylene (LDPE 1550P from Eastman Chemical Company of Kingsport, Tenn.), 30 percent by weight polystyrene 615 from Dow Chemical Company of Midland, Mich., and 1.5 percent by weight SAFoam™ endothermic chemical blowing agent comprising a mixture of sodium salt of polycarbonic acid and carbonate compounds (from Reedy International Corporation). In this example, the extruder was set at a speed of 40 rpm. The resulting carrier tape had a density of 0.68 grams per cubic centimeter, the tensile strength at break was 848 psi, and the percent elongation was 6 percent.

In the second example, the composition of the material blend comprised 59 percent by weight low density polyethylene (LDPE 1550P from Eastman Chemical Company), 40 percent by weight high density polyethylene (HDPE 3150B from Quantum Chemical Company of Cincinnati, Ohio) and 1 percent by weight SAFoam™ endothermic chemical blowing agent. In this example, the extruder was set at a speed of 55 rpm. The resulting carrier tape had a density of 0.58 grams per cubic centimeter, the tensile strength at break was 722 psi, and the percent elongation was 5 percent.

In each of the examples, which satisfied the parameters necessary for an acceptable carrier tape, the general condition of the loaded carrier tape was determined by examining the carrier tape. No visible tears or breaks were present in the strip portions of the examples. The bottom strip and cover tape were adequately adhered to the strip portion to store and protect the components contained in the openings (i.e., the bottom strip was secured to the strip portion and the cover tape remained laminated to the strip portion until it was physically peeled away from the strip portion, yet the cover strip could be peeled from the strip portion without causing damage to the strip portion). No visible stray dust or fibers from the strip portion were present either in the pockets or on the surface of the carrier tape.

The present invention has now been described with reference to several embodiments thereof It will be apparent to those skilled in the art that many changes can be made to the embodiments described without departing from the scope of the invention. Hence, the scope of the present invention shall not be limited by the structures described herein, but only by structures described by the language of the claims and the equivalents of those structures.

The embodiments for which an exclusive property or privilege is claimed are defined as follows:

1. A component carrier tape comprising:
   a single layer elongated flexible strip portion having properties suitable for storing and transporting a plurality of components, the single layer strip portion having a first surface, a second surface opposite the first surface, and a plurality of openings spaced along the strip portion and extending through the strip portion between the first and second surfaces for receiving the plurality of components, wherein the strip portion comprises a layer of thermoplastic polymeric foam; and
   a bottom strip bonded to the second surface of the strip portion, extending along the strip portion, and covering at least a portion of the plurality of spaced openings.

2. The carrier tape of claim 1, further comprising a top cover tape releasably secured to the first surface of the strip portion, extending along the strip portion, and covering at least a portion of the plurality of spaced openings.

3. The carrier tape of claim 1, wherein the thermoplastic polymeric foam comprises a blend of polystyrene and polyethylene.

4. The carrier tape of claim 3, wherein the thermoplastic polymeric foam comprises greater than 50 percent by weight polyethylene.

5. The carrier tape of claim 3, wherein the blend for thermoplastic polymeric foam comprises about 10 to 49 percent by weight polystyrene and about 51 to 90 percent by weight polyethylene, wherein the sum of polystyrene and polyethylene is 100 weight percent.

6. The carrier tape of claim 5, wherein the thermoplastic polymeric foam further comprises residue from a foaming agent.

7. The carrier tape of claim 1, wherein at least one of the plurality of spaced openings contains a component.

8. The carrier tape of claim 1, wherein the strip portion further comprises a means for advancing the carrier tape by an advancement mechanism.

9. The carrier tape of claim 1, wherein the carrier tape is electrically dissipative.

10. The carrier tape of claim 1, wherein the layer of thermoplastic polymeric foam has about 10 to 60 percent open spaces.

11. The carrier tape of claim 10, wherein the open spaces contain air.

12. The carrier tape of claim 1, wherein the layer of thermoplastic polymeric foam has an average density of about 0.25 to 1.0 grams per cubic centimeter.

13. The carrier tape of claim 1, wherein the plurality of spaced openings includes more than one aligned column of spaced openings extending along the length of the strip portion.

14. The carrier tape of claim 1, wherein the carrier tape is wound about the core of a reel.

15. The carrier tape of claim 1, wherein the thermoplastic polymeric foam before extrusion comprises a blend of materials, the blend comprising about 10 to 49 percent by weight polystyrene, about 51 to 90 percent by weight polyethylene, and 0.2 to 5 percent by weight foaming agent, wherein the sum of the polystyrene, polyethylene, and foaming agent is 100 weight percent.

16. A non-fibrous elongated flexible component carrier tape for storing and transporting a plurality of components, the carrier tape comprising:

a strip portion having a first surface, a second surface opposite the first surface, and a plurality of openings spaced along the strip portion and extending through the strip portion between the first and second surfaces for receiving the plurality of components, wherein the strip portion comprises a layer of thermoplastic polymeric foam; and a bottom strip bonded to the second surface of the strip portion, extending along the strip portion, and covering at least a portion of the plurality of spaced openings.

17. An elongated flexible component carrier tape for storing and transporting a plurality of components, the carrier tape comprising:

a strip portion having a first surface, a second surface opposite the first surface, a means for advancing the carrier tape by an advancement mechanism, and a plurality of openings spaced along the strip portion and extending through the strip portion between the first and second surfaces for receiving the plurality of components, wherein the strip portion comprises a layer of thermoplastic polymeric foam, the thermoplastic polymeric foam comprising a blend of materials, the blend comprising about 10 to 49 percent polystyrene by weight and about 51 to 90 percent polyethylene by weight, wherein the sum of the polystyrene and polyethylene is 100 weight percent; and a bottom strip bonded to the second surface of the strip portion, extending along the strip portion, and covering at least a portion of the plurality of spaced openings.

\* \* \* \* \*